United States Patent [19]
Robertson

[11] Patent Number: 5,182,780
[45] Date of Patent: Jan. 26, 1993

[54] OPTICAL BACKPLANE INTERCONNECTING CIRCUIT BOARDS

[75] Inventor: Stuart C. Robertson, North Watford, England

[73] Assignee: GPT Limited, England

[21] Appl. No.: 791,458

[22] Filed: Nov. 13, 1991

[30] Foreign Application Priority Data

Nov. 14, 1990 [GB] United Kingdom ........... 9024713

[51] Int. Cl.[5] .............. G02B 6/26; G03H 1/02; H01J 5/16
[52] U.S. Cl. .............. 385/14; 385/31; 385/38; 385/53; 385/129; 359/1; 359/15; 359/27; 359/34; 250/227.11
[58] Field of Search ............ 385/14, 31, 88, 89, 385/38, 92, 93, 94, 129, 130, 53; 359/1, 15, 34, 27; 250/227.11, 551

[56] References Cited

U.S. PATENT DOCUMENTS

| | | | |
|---|---|---|---|
| 4,671,603 | 6/1987 | McQuoid et al. | 359/15 |
| 4,720,634 | 1/1988 | D'Auria et al. | 250/551 |
| 4,807,955 | 2/1989 | Ashman et al. | 385/88 |
| 4,838,630 | 6/1989 | Jannson et al. | 359/15 |
| 4,946,253 | 8/1990 | Kostuck | 359/15 |
| 5,040,868 | 8/1991 | Waitl et al. | 385/88 |
| 5,061,027 | 10/1991 | Richard | 385/14 |
| 5,073,000 | 12/1991 | Derfiny | 385/88 |
| 5,101,465 | 3/1992 | Murphy | 385/88 |

*Primary Examiner*—Brian Healy
*Attorney, Agent, or Firm*—Kirschstein, Ottinger, Israel & Schiffmiller

[57] ABSTRACT

A system for interconnection of a stack of circuit boards, wherein each of at least a plurality of the circuit boards has an end region carrying one or more light transmitters or light receivers, an optical structure forming an interconnecting backplane for the circuit boards, the optical structure comprising a first surface carrying a multiplicity of hologram elements disposed to receive light beams from said light transmitters and to route said light beams to a second reflective surface where said light beams are reflected back to said hologram elements for routing to said light receivers.

13 Claims, 4 Drawing Sheets

Fig. 2.

| 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|
| S11 | S21 | S31 | S41 | S51 | D51 | D41 | D31 | D21 | D11 | C | S11 | S21 | S31 | S41 | S51 | D51 | D41 | D31 | D21 | R11 |
| S12 | S22 | S32 | S42 | X | X | D42 | D32 | D22 | D12 | L | S12 | S22 | S32 | S42 | X | X | D42 | D32 | D22 | R12 |
| S13 | S23 | S33 | X | X | X | X | D33 | D23 | D13 | O | S13 | S23 | S33 | X | X | X | X | D33 | D23 | R13 |
| S14 | S24 | X | X | X | X | X | X | D24 | D14 | C | S14 | S24 | X | X | X | X | X | X | D24 | R14 |
| S15 | X | | | | | | | | D15 | K | S15 | X | | | | | | | X | R15 |

LEFT SECTION — RIGHT SECTION

OPTICAL BACKPLANE INTERCONNECTING CIRCUIT BOARDS

FIELD OF THE INVENTION

This invention relates to a system for interconnection of a stack of circuit broads, and relates particularly though not exclusively to circuit cards used in telecommunications switches or computers.

BACKGROUND ART

In the field of telecommunications switches, with increased circuit density and higher switch speed rates (200 Mbits$^{-1}$ increasing to 2.4 Gbits$^{-1}$ in the future), many proposals have been made for more efficient interconnections of the circuit boards comprising the switch. One area of critical importance is the backplane or motherboard which provides interconnections between the circuit boards. In addition to considerations such as removing heat generated during operation, one important consideration is distribution of clock signals etc to the various boards; at such high bit rates, the problems of propagation delay, bandwidth and crosstalk arise by the clock signals being conducted along conductors in the backplane.

It is known, see K. H. Brenner and F. Sauer "Diffractive-Reflective Optical Interconnects" Applied Optics Oct. 15, 1988, Vol 27, No. 20 to employ hologram elements disposed on a surface to reflect or refract light between transmitters and receivers on an adjacent substrate. Usually the transmitters and receivers form part of an array of integrated circuit chips and the light is employed to distribute signals to the various chips with increased efficiency. The surface carrying the holograms is normally bonded to the chip substrate via a transparent medium to form a compact and monolithic assembly: this is required because of the high accuracy required in alignment of the various optical paths.

SUMMARY OF THE INVENTION

It is an object of the present invention to provide a system for interconnection of a stack of circuit boards which overcomes the problems outlined above.

The present invention provides a system for interconnection of a stack of circuit boards, wherein each of at least a plurality of the circuit boards has an end region carrying one or more light transmitters or light receivers, an optical structure forming an interconnecting backplane for the circuit boards, the optical structure comprising a first surface carrying a multiplicity of hologram elements disposed to receive light from said light transmitters and to route such light to a second reflective surface where the light is reflected back to said hologram elements for routing to said light receivers.

Thus in accordance with the invention, by providing an optical structure which provides an interconnecting backplane for the circuit boards, the problems of known backplanes are overcome, in particular the problems with very high signal bit rates.

A further advantage of an optical interconnection scheme is a reduction of the insertion force and the alignment requirements of the connectors. An optical connector requires only the force to mate an alignment shell and a few electrical services such as power and clock. By contrast the electrical connector has to reliably mate a large number of pins requiring a large insertion force. This force together with the long thin board design introduces considerable problems relating to flexing and bowing of the cards and connectors.

Further a trade-off can be made between the optical power budget and the alignment requirements. By expanding the laser beam the lateral tolerance can be considerably relaxed at the expense of an accompanying power budget penalty. However, since laser sources (whose maximum power is limited only by safety considerations) are used and the transmission distances are short a considerable design margin in the power budget exists. This makes it possible to make allowance for bow in the boards, slight misalignment of connectors, or connectors not fully engaging.

As regards environmental stability of the optical structure, free space optical interconnection techniques are susceptible to particles obscuring the beam. These can either be transient effects such as an air borne particle moving through the beam causing momentary dropout of the signal or more permanent effects such as particles becoming adhered to the surface of mirrors or lenses. The optical structure may use a solid glass or plastic structures for the majority of the beam propagation paths. In addition to confining the beam and thus preventing problems with dust this has the added advantage of giving the optical structure mechanical stability thus reducing alignment problems. The use of plastics also allow the parts to be cast or moulded at low costs. The disadvantage of using a solid medium for the optical interconnect region is, however, the reduction of ventilation routes along the back of a rack. Alternatively and as preferred free space is employed as the optical medium and a flexible (rubber) sealing surround is provided between the circuit cards and the optical backplane to prevent the ingress of dust.

Careful mechanical design of the system is required at two main stages. First, the initial system must be straight forward to align during manufacture. Second, the system must remain aligned during shipping and use. This is particularly important for the holographic system where the sensitivity to alignment is greatest.

A further consideration with holographic techniques relates to the temperature and the humidity range experienced by the components both during shipping and operation. Some of the high efficiency materials used for the fabrication of the holographic optical elements such as dichromated gelatin (DCG) have a high sensitivity to humidity requiring coatings to protect them.

To this end, said first surface on which the hologram elements are mounted is formed by a transparent sheet which either carries said second reflective surface, or is bonded to another transparent sheet carrying said second reflective surface, to form a monolithic structure. Such structure is mounted securely to a framework for housing the printed circuit boards. A metal block is secured to the end of each printed circuit board adjacent the backplane and carries the transmitter and receiver optical elements which are mounted in holes accurately positioned in the metal block. The framework for the PCB stack carries reference surfaces adjacent the backplane and as each PCB is positioned into the framework, the metal block abuts the reference surfaces to accurately space the block from the holograms. In addition in accordance with a further preferred feature of the invention the metal block carries one or more projecting and tapering members, for example a spike, for registering in holes in the first surface for alignment of the optics. Alternatively the first surface may carry projecting members for registering in apertures in this block. In any event the circuit board is provided with "pusher" members for guiding and maneuvering the board into its registering and aligned position.

At the very high bit rates employed it will be important to minimise the distances of the electrical interface between optical transmitter and receiver and MUX/DEMUX chips respectively. For ease of construction it may then be preferable to use an optical fibre 'light pipe' to route the optical signal to a more convenient position on the printed circuit board.

BRIEF DESCRIPTION OF THE DRAWINGS

A preferred embodiment of the invention will now be described with reference to the accompanying drawings, wherein:

FIG. 2 is an interconnection pattern for the backplane of FIG. 1;

DESCRIPTION OF THE PREFERRED EMBODIMENT

Figure 1:
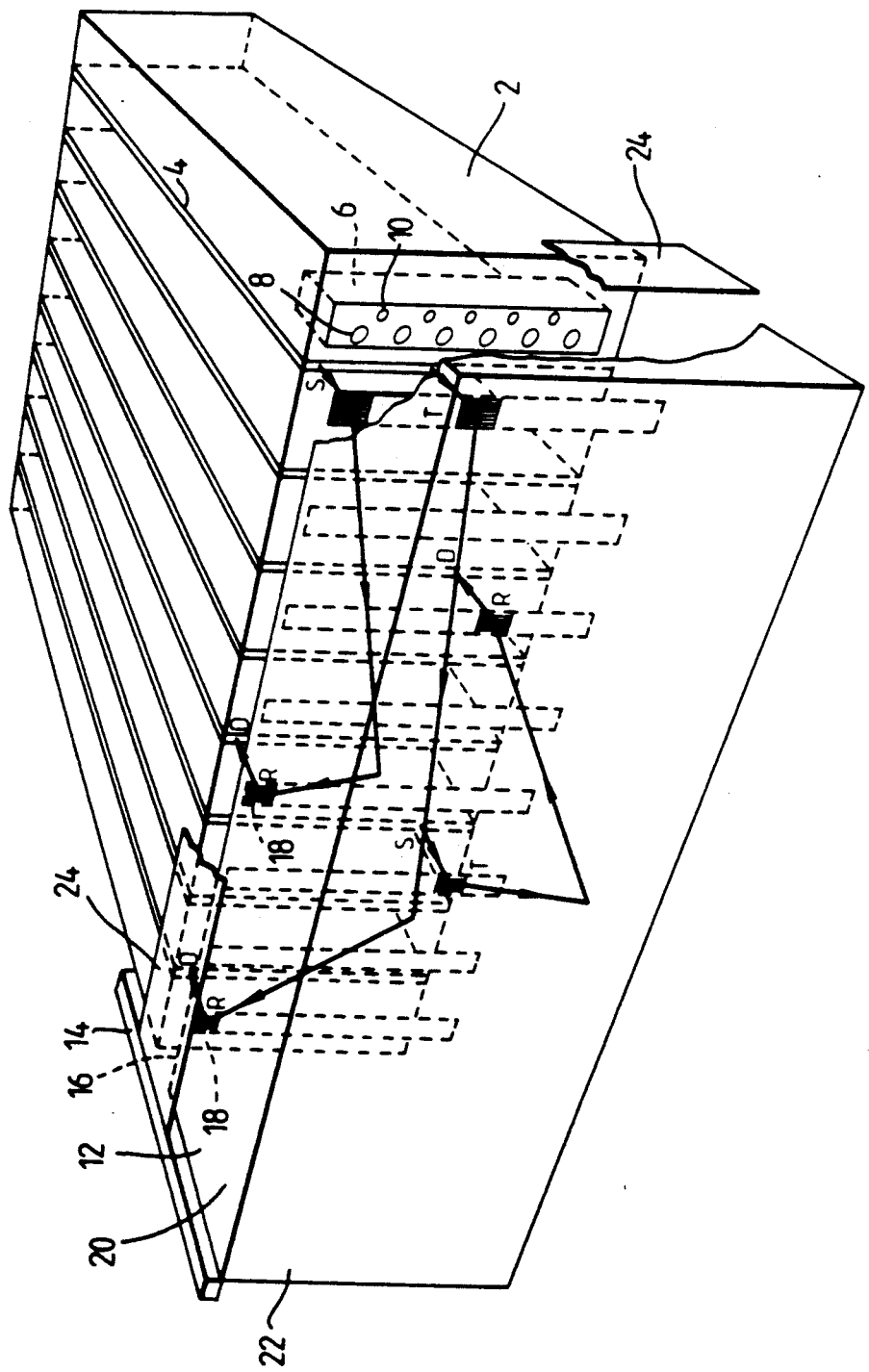
FIG. 1 is a schematic view of the layout of an optical backplane in accordance with the invention interconnecting a stack of circuit cards.

Referring now to FIG. 1, a rack 2 provides a framework for housing a stack of printed circuit cards 4. Each card has at its rear end a block 6 housing a plurality of transmitters 8 and receivers 10. An optical backplane 12 is rigidly mounted to rack 2 by framework members 14 and comprises a surface 16 carrying a plurality of hologram elements 18. The surface 16 is provided by a silver halide holographic plate which is aligned and bonded to an optically transparent solid polymeric block 20. A back reflector 22 is deposited directly on the back of polymeric plate 20.

The holograms are so arranged in relation to the transmitters 8 and receivers 10 that light from a transmitter is refracted by a first hologram into a predetermined direction, reflected from reflective plate 22 to another hologram element, whence it is against refracted to a desired receiver or photo detector 10. This is indicated schematically in FIG. 1. The holographic elements are arranged such that a collimated beam entering a first hologram perpendicular to the first surface emerges perpendicular at the desired output point. A flexible rubber cover 24 is positioned around the free space between rack 2 and the optical backplate in order to prevent the ingress of dirt which might interfere with the laser beams.

Figure 4:
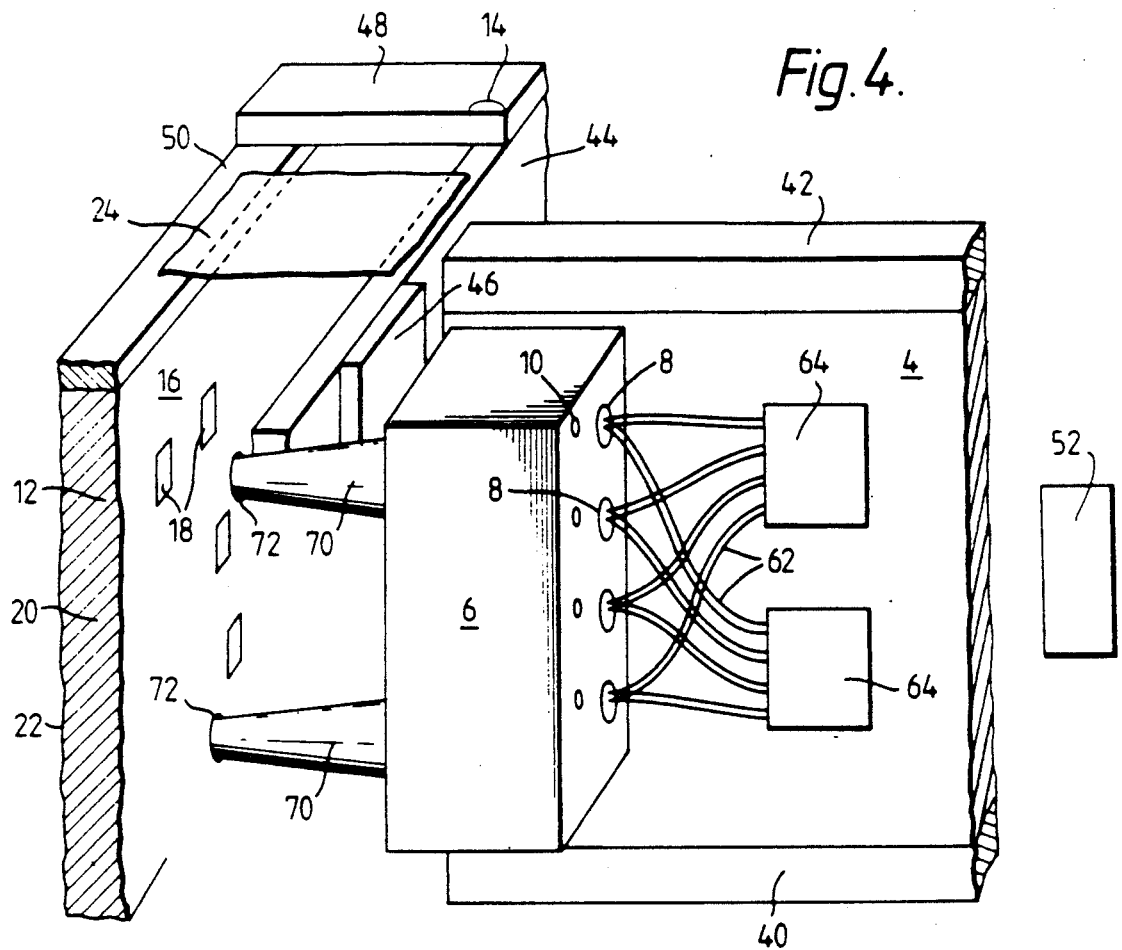
FIG. 4 is a more detailed view of the mechanical construction of the backplane.
Figure 5:
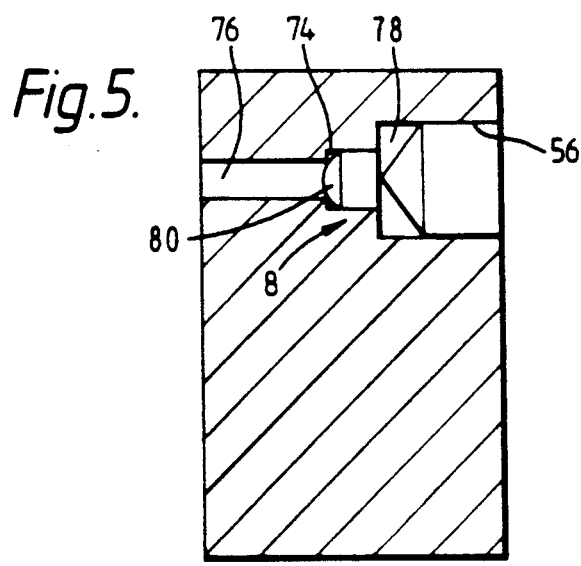
FIG. 5 is a sectional view of the block of FIG. 4 secured to a circuit card carrying the optical transmitters and receivers.

Referring now to FIG. 4 this shows the construction illustrated in FIG. 1 in more detail. In addition, FIG. 5 is a sectional view of block 6.

Each PCB 4 is mounted in top and bottom slide rails 40, 42 for permitting the PCB to be slide in and out easily from rack 2. The slide rails 40, 42 are secured at the rear end of rack 2 to an orthogonal framework 44 which provides reference surfaces 46. In addition, framework 44 has extension portions 48 for securing a rectangular frame member 50 which secures block 20 in position.

Each PCB 4 has at its front end pusher members 52 for pushing the circuit card into the rack and for maneuvering the circuit card, as will be explained below. The rear end of the circuit card carries aluminum rectangular block 6 which is screwed to the circuit board and which contains rows of through holes 56, which house photo detectors 10 and laser transmitters 8 respectively. These detectors and laser transmitters are coupled via short electrical leads 62 to MUX/DEMUX chips 64. As an alternative construction leads 62 may be replaced by optical fibres, and the laser sources and photo detectors may be mounted on the circuit board.

The rear end of block 6 carries two tapering conical spike members 70 which engage in registering apertures 72 in block 20. Pusher members 52 are held manually when circuit board 4 is inserted into rails 40, 42 and the board is manoeuvered so that block 6 comes to rest against reference surfaces 46 while projecting members 70 engage in apertures 72.

Referring to FIG. 5 which shows the optics associated with a laser transmitter 8, laser diode 78 emits visible light which is collimated using a single planoconvex lens 80. The focal length of the lens was 1.47 mm with a $3\sigma$ distribution of less than 1%. Since the variation between the focal length of the lenses is small it is possible to avoid the need for an individual focusing arrangement for each lens. A shoulder 74 within the hole in the heat sink block is used to provide the alignment of the lens position. Since the normal operating power for the laser is 3 times the eye safe limit it is possible to use a restricted aperture 76 to reduce the astigmatism in the laser output. The aperture 76 was arranged to clip the large angle axis before the lens thus providing a more circular symmetric output beam but still at the required level of $\approx 1$ mW.

The holograms 18 on a photographic plate are mounted to the solid polymer block 20 using an optically curing epoxy resin. The fast curing allowed the holograms to be aligned and then bonded into position. The advantages of the solid structure are that it will remain aligned during use and it also prevents dust and other unwanted particles from blocking the beam. A poly-methyl methacrylate (PMMA) polymer was used since it has good mechanical properties and has a minimum loss near the 670 nm operating wavelength. The path length of each beam varies as a function of projected angle, between 300 mm and 470 mm.

The block 20 is precision cut such that the front and back faces were parallel and perpendicular to the other faces. Then a final polish was applied to the two faces. Precision cutting and polishing processes are used to minimise the amount of stress induced in the blocks.

After polishing reflective surface 22 is applied directly to the back surface of the block. The reflector is created using a high vacuum aluminum evaporation process. Since the back face has been cut and polished perpendicular no further alignment of the reflector is necessary. The reflection at the surface was measured at HeNe as 75.6%. The surace is cleaned rigorously before aluminiumisation so that a good adhesion to the polymer is achieved. However, a protective film or lamination is required to prevent damage from abrasion or chemical attack.

Figure 3A:
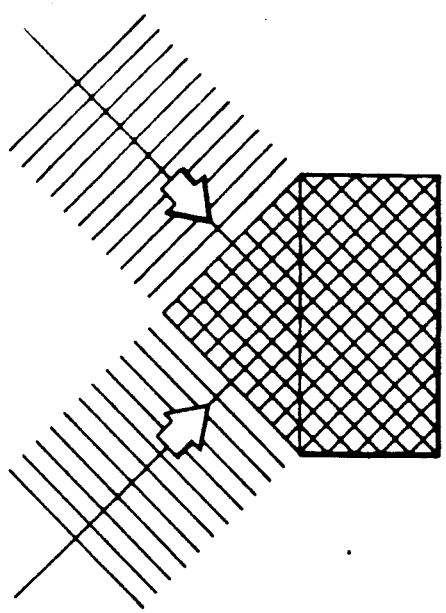
FIG. 3 are schematic views of the manner of formation of a hologram.
Figure 3B:
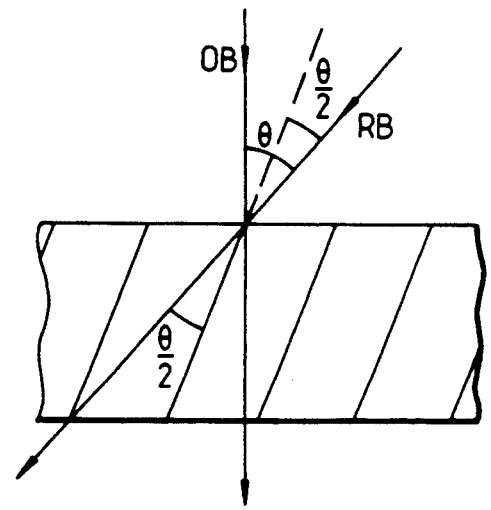
Figure 3C:
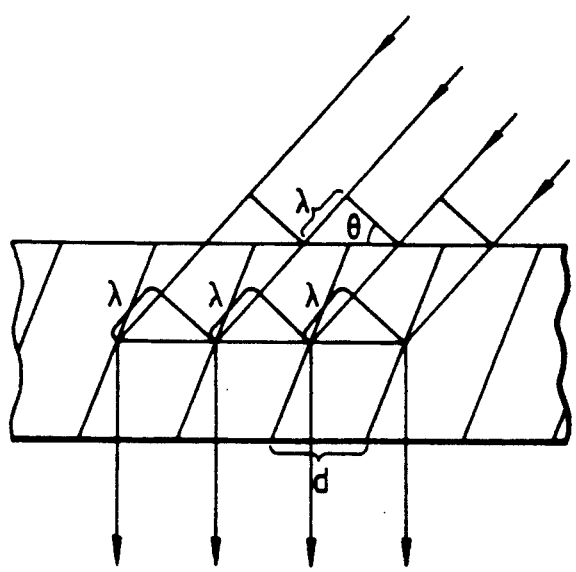

The holograms for the backplane were fabricated using Agfa 8E75HD silver halide holographic plates. The output from a HeNe laser (633 nm wavelength) was split into two collimated plane waves. The two beams were incident onto the holographic plate from the same side of the plate such that interference fringes were constructed in the photographic material (FIG. 3). The bright fringes exposes the silver halide releasing free silver atoms. Developing the plates then fixes the interference fringes as a variation in the absorption of the photographic emulsion. A bleaching process is then used to convert the silver atoms back into stable silver halide thus giving the required refractive index variation. Since the holograms were recorded using beams from the same side of the plate when the hologram is replayed with a beam transmitted through the hologram the beam is steered through an angle $\theta$. As the object beam was normal to the plate the angle $\theta$ is the angle at which the reference beam illuminates the plate in air. The holograms are bonded to a polymer block and a correction for the refraction at the hologram/polymer interface has to be made using Snell's law.

The percentage of power in the desired first order beam varies with the steering angle required. For the type of holographic media used a range of angles from 35° to 70° were tested. The range of angles available is limited by the thickness of the holographic emulsion and maximum spatial frequency achievable in the emulsion. In the plates used the emulsion thickness is $\approx 5$ $\mu$m. At this thickness the plates behave partly as a thick hologram and partly as a thin hologram. Thus if both the reference and object recording beams are approximately normal to the plate surface (low steering angles) the emulsion thickness 'seen' by the light is small and the hologram behaves as a thin grating. In such a case multiple orders are generated resulting in a large number of unwanted beams and a reduction in the power in the output beam. At high deflection angles the spatial frequency required in the holographic material increases. Since there is a finite grain size for the silver halide plates this sets the maximum angle through which the beam can be deviated.

Using an alternative thicker volume hologram material such as dichromated gelatine or a photo-polymer will extend the range of angles achievable. Although this will increase the range of angles achievable other factors will limit the eventual performance.

Each of the holographic optical elements is characterised at the HeNe 633 nm wave length. The percentage power in the zero and first order, (straight through and the required steered beam) is measured. From this, the conversion efficiency, the ratio of power in the first order as a percentage of the input power, is calculated. The highest efficiencies are obtained in the middle of the angle range and declined at larger angles. The average conversion efficiency at 35.06° is 40% or 4 dB.

I claim:

1. A system for interconnection of a stack of circuit boards, wherein each of at least a plurality of the circuit boards has an end region carrying one or more light transmitters or light receivers, an optical structure forming an interconnecting backplane for the circuit boards, the optical structure comprising a first surface carrying a multiplicity of non-reflecting hologram elements disposed to receive light beams from said light transmitters and to route said light beams to a second reflective surface where said light beams are reflected back to said hologram elements for routing to said light receivers.

2. A system as claimed in claim 1, wherein each circuit board has a heat sink block secured to said end region of the circuit board, each block having within it apertures carrying one or more transmitter and/or receiver elements.

3. A system as claimed in claim 2, wherein each block has two columns of apertures, one column carrying a plurality of the transmitter elements and the other column carrying a plurality of the receiver elements.

4. A system as claimed in claim 2 wherein each transmitter element comprises a visible laser diode source.

5. A system as claimed in claim 2 wherein each transmitter element abuts against a shoulder in a respective aperture, and a collimating lens is positioned against a further shoulder in the aperture.

6. A system as claimed in claim 2 wherein the transmitter and receiver elements are connected via short electrical leads to MUX/DEMUX circuits on the circuit board.

7. A system as claimed in claim 1, including means for aligning the circuit cards in predetermined positions relative to the optical structure upon insertion into the stack for correct routing of said light beams.

8. A system as claimed in claim 7, wherein the means for aligning includes a reference surface against which a block on each circuit board abuts when a respective circuit board is inserted in order to define a predetermined spacing between a respective block and the hologram elements.

9. A system as claimed in claim 7, wherein each circuit card and said first surface respectively include co-operating tapering locating members and registering apertures which interengage upon insertion of the respective circuit card into the stack in order to locate the transmitters and receivers in predetermined positions relative to the hologram elements.

10. A system as claimed in claim 9, wherein said tapering locating members are spike members for engaging in the registering apertures in said first surface.

11. A system as claimed in claim 9, wherein each circuit card includes one or more manually engageable pusher members for pushing the respective circuit card into the stack and for interengaging the co-operating locating members and registering apertures.

12. A system as claimed in claim 1, wherein the first surface comprises a photographic plate bonded to a polymeric block housing, said second reflective surface being formed on a rear surface of the block housing.

13. A system as claimed in claim 1, wherein the end region of each circuit board is spaced at a free air space from the optical structure, and including a flexible cover member surrounding the free air space.

* * * * *